United States Patent [19]
Ito et al.

[11] Patent Number: 5,818,380
[45] Date of Patent: Oct. 6, 1998

[54] ANALOG-DIGITAL CONVERTER CAPABLE OF REDUCING A CONVERSATION ERROR OF AN OUTPUT SIGNAL

[75] Inventors: Masao Ito; Takahiro Miki; Shiro Hosotani, all of Hyogo, Japan

[73] Assignee: Mitsubishi Denki Kabushiki Kaisha, Tokyo, Japan

[21] Appl. No.: 824,549

[22] Filed: Mar. 25, 1997

Related U.S. Application Data

[63] Continuation of Ser. No. 462,462, Jun. 5, 1995, abandoned.

[30] Foreign Application Priority Data

Sep. 14, 1994 [JP] Japan ................................. 6-220142

[51] Int. Cl.$^6$ ...................................................... H03M 1/36
[52] U.S. Cl. .............................. 341/160; 341/94; 326/11
[58] Field of Search ............................ 341/94, 158–160; 326/11, 36

[56] References Cited

U.S. PATENT DOCUMENTS

| | | | |
|---|---|---|---|
| 4,091,293 | 5/1978 | Ando | 307/205 |
| 4,417,269 | 11/1983 | Dischert | 358/12 |
| 4,423,339 | 12/1983 | Seelbach et al. | 307/464 |
| 4,449,118 | 5/1984 | Dingwall et al. | 340/347 AD |
| 4,596,978 | 6/1986 | Fujita | 340/347 AD |
| 4,884,075 | 11/1989 | Mangelsdorf | 341/159 |
| 5,029,305 | 7/1991 | Richardson | 341/159 |
| 5,140,594 | 8/1992 | Haulin | 371/36 |
| 5,281,871 | 1/1994 | Mori et al. | 307/454 |
| 5,402,128 | 3/1995 | Kusumoto et al. | 341/172 |

FOREIGN PATENT DOCUMENTS

| | | |
|---|---|---|
| 60-249430 | 12/1985 | Japan . |
| 61-289730 | 12/1986 | Japan . |
| 1-88028 | 7/1989 | Japan . |

OTHER PUBLICATIONS

An 200 Msps 8–bit A/D Converter with a Duplex Gray Coding, pp. 109–110, IEEE, 1991, A. Matsuawa et al.
An 8b 500MHz ADC, pp. 172–173, IEEE 1991, Yuji Gendai.
A 6b 1GHz Dual–Parallel A/D Converter, pp. 174–175, IEEE 1991, Akira Matsuzawa et al.

*Primary Examiner*—Brian K. Young
*Assistant Examiner*—Jason L. W. Kost
*Attorney, Agent, or Firm*—McDermott, Will & Emery

[57] ABSTRACT

A majority logic circuit is supplied with output values of adjacent three comparators. The majority logic circuit outputs, as an output signal, the supplied three output values including at least two equal output values. Inverter circuits and AND circuits produce and output a read signal of an encoder which is a logical product between the output signal and an inverted signal of the output signal.

19 Claims, 9 Drawing Sheets

ANALOG-DIGITAL CONVERTER CAPABLE OF REDUCING A CONVERSATION ERROR OF AN OUTPUT SIGNAL

This application is a continuation of application Ser. No. 08/462,462 filed Jun. 5, 1995 now abandoned.

BACKGROUND OF THE INVENTION

1. Field of the Invention

The present invention relates to an analog-digital converter, and in particular to an analog-digital converter producing read signals for an encoder from output signals of a plurality of comparators.

2. Description of the Background Art

An analog-digital converter (which will be referred to as an "A/D converter" below) in the prior art will be described below with reference to the drawings.

FIG. 10 is a block diagram showing a structure of a conventional A/D converter. FIG. 10 shows, as an example, a parallel A/D converter which converts an analog input signal into a digital code of 3 bits.

Referring to FIG. 10, the A/D converter includes a reference voltage generating circuit VG, switch units SU1 and SU2, comparators CP1–CP7, a determining circuit DU and an encoder EN.

Reference voltage generating circuit VG outputs 3 bits of reference voltage VR, i.e., reference voltages Vr1–Vr7 which are produced by equally dividing the reference voltage into eight via switch unit SUI to comparators CP1–CP7. Switch unit SU2 is supplied with an analog input voltage VIN. Analog input voltage VIN is supplied via switch unit SU2 to comparators CP1–CP7. Switch unit SU1 is supplied with a control signal Si (not shown), and supplies reference voltages Vr1–Vr7 to corresponding comparators CP1–CP7 in accordance with control signal S1. Switch unit SU2 is supplied with a control signal S2 (not shown), and supplies analog voltage VIN to corresponding comparators CP1–CP7 in accordance with control signal S2. FIG. 11 shows control signals SI and S2 supplied to switch units SU1 and SU2.

Each of comparators CP1–CP7 compares reference voltage $Vr_i$ (i=1–7) with analog input voltage VIN, and outputs a logical value $C_i$ (i=1–7) if analog input voltage VIN is larger than reference voltage $Vr_i$. If analog input voltage VIN is smaller than reference voltage $Vr_i$, logical value $C_i$ of "L" is output.

Output ends of comparators CP1–CP7 are connected to determining circuit DU. Determining circuit DU uses respective logical values $C_i$ sent from comparators CP1–CP7 to produce read signals of encoder EN provided at the subsequent stage. Thus, only one of eight read signals J–J8 is "H", and all the other reading signals are "L". Encoder EN outputs a digital code D1–D3 of 3 bits, which will form the output signal of the A/D converter, in accordance with read signals J1–J8.

Determining circuit DU shown in FIG. 10 will be described below more specifically. FIG. 12 is a circuit diagram showing a structure of the determining circuit shown in FIG. 10.

Referring to FIG. 12, the determining circuit includes inverter circuits G101–G107 and AND circuits G11–G118.

AND circuits G111–G118 each receive on one of its input ends the corresponding one of logical values C1–C7, which are sent from comparators CP1–CP7 via corresponding inverter circuits G101–G107, respectively. AND circuit G118 has input ends, one of which is connected to power supply potential VDD and receives logical value "H". Meanwhile, other input of each of AND circuits G112–G117 receives corresponding logical value C2–C8 sent from comparator CP2–CPB. Other input of AND circuit G111 is connected to power supply potential VDD and receives logical value "H".

Table 1 shows a relationship among logical values C1–C7 sent from comparators CP1–CP7, output signals of the determining circuit, i.e., encoder read signal J1–J8, and output codes D1–D3 of the encoder.

TABLE 1

| Output Values of Comparators | | | | | | | Output Values of Determining Circuit | | | | | | | | Output Codes | | |
|---|---|---|---|---|---|---|---|---|---|---|---|---|---|---|---|---|---|
| C1 | C2 | C3 | C4 | C5 | C6 | C7 | J1 | J2 | J3 | J4 | 35 | J6 | 37 | J8 | D1 | D2 | D3 |
| H | H | H | H | H | H | H | L | L | L | L | L | L | L | H | 1 | 1 | 1 |
| H | H | H | H | H | H | L | L | L | L | L | L | L | H | L | 0 | 1 | 1 |
| H | H | H | H | H | L | L | L | L | L | L | L | H | L | L | 1 | 0 | 1 |
| H | H | H | H | L | L | L | L | L | L | L | H | L | L | L | 0 | 0 | 1 |
| H | H | H | L | L | L | L | L | L | L | H | L | L | L | L | 1 | 1 | 0 |
| H | H | L | L | L | L | L | L | L | H | L | L | L | L | L | 0 | 1 | 0 |
| H | L | L | L | L | L | L | L | H | L | L | L | L | L | L | 1 | 0 | 0 |
| L | L | L | L | L | L | L | H | L | L | L | L | L | L | L | 0 | 0 | 0 |

Reference voltage Vr1–Vr7 applied to comparators CP1–CP7 have a relationship of Vr1<Vr2< . . . Vr7, and for this purpose, correctly output logical values $C_i$ are set as shown in Table 1. More specifically, if logical value $C_k$ (j<k) output from comparator $CP_k$ is "H", all logical values $C_j$ (J<k) output from comparators $CP_j$ are "H", and all logical values $C_n$ (n>k) output from comparators $CP_n$ are "L". For example, if logical values $C_i$ output from comparator $CP_i$ (i=1–7) are (H, H, H, H, L, L, L), only output signal J5 of determining circuit DU is "H", the other output signals J1–J4 and J6–J8 are "L", and encoder EN outputs the digital code of "100".

According to the above operation, determining circuit DU determines the output changing from "H" to "L" based on outputs C1–C7 of comparators CP1–CP7, and the encoder supplies output code D1–D3 according to outputs C1–C7.

Recently, in the field of image processing, there has been a demand for an A/D converter which converts an analog signal into a digital code of 10 bits or more. Further, in the field of electronic equipments for commercial use, it has been desired to form the A/D converter on the same semiconductor substrate as a semiconductor integrated circuit device for digital signal processing in order to reduce a manufacturing cost, reduce an area of the semiconductor integrated circuit device and suppress noise interference on a board bearing various semiconductor integrated circuit devices. In this case, as the bit number N of digital code increases, the reference voltage to be compared by the comparator in the A/D converter is divided into 2N to form ½N of reference voltage, and thus the comparator must compare an extremely minute potential difference. Further, in accordance with lowering of the power supply voltage used by the semiconductor integrated circuit device for digital signal processing, the voltage used by the A/D converter must be lowered, so that the reference potential applied to a reference voltage generating circuit is lowered, and thus the reference voltage is divided to form a smaller voltage. If the A/D converter is formed on the same semiconductor substrate as the semiconductor integrated circuit device for digital signal processing by the above reason, the influence by noises transmitted via the semiconductor substrate from the semiconductor integrated circuit device increases.

Therefore, the conventional A/D converter may suffer from a problem that the comparator cannot accurately obtain the potential difference between the reference voltage and the analog input voltage due to variation of configurations of elements such as transistors forming the comparator and variation of the physical characteristics. As a result, it may be impossible to conform to the rules to which the normally operating comparator must conform, i.e., the rules that if the logical value $C_k$ output from comparator $CP_k$ (k=2–7) is "H", all logical values $C_j$ output from comparators $CP_j$ (J<k) are "H", and all logical values $C_n$ output from comparators $CP_n$ are "L".

Therefore, abnormal combination of the values, e.g., shown in the following Table 2 may occur when (H, H, H, H, L, L, L) should be obtained in accordance with the correct logical values $C_i$ output from comparators $CP_i$ (i=1–7).

As described above, if the comparator outputs an erroneous value, the A/D converter outputs the digital code significantly different from the correct value. For example, in the A/D converter used for image processing, the error of digital code causes disadvantages such as stripe noises on the screen, resulting in deterioration of image quality.

SUMMARY OF THE INVENTION

An object of the invention is to provide an A/D converter which can convert an analog signal into a digital signal without causing a significant error even when a comparator outputs an erroneous output value.

An A/D converter according to an aspect of the invention for converting an analog signal into a digital signal to be output, includes a plurality of comparators making comparison between a potential of the analog signal and a reference potential, a majority logic circuit for producing an encode output signal from output signals sent from the plurality of comparators using majority logic, and an encoder encoding the encode output signal for outputting the digital signal. The reference potential includes a first reference potential, a second reference potential lower than the first reference potential, a third reference potential lower than the second reference potential, and a fourth reference potential lower than the third reference potential. The plurality of comparators include a first comparator outputting a first comparison result signal $C_{i+1}$ indicating a result of comparison between the potential of the analog signal and the first reference potential, a second comparator outputting a second comparison result signal $C_i$ indicating a result of comparison between the potential of the analog signal and the second reference potential, a third comparator outputting a third comparison result signal $C_{i-1}$ indicating a result of comparison between the potential of the analog signal and the third

TABLE 2

|  | | | | | | | | | | | | | | | | Output Codes | | | | | |
|  | Output Values of Comparators | | | | | | | Output Values of Determining Circuit | | | | | | | | 0 pry | | | 1 pry | | |
|  | C1 | C2 | C3 | C4 | C5 | C6 | C7 | J1 | J2 | J3 | J4 | J5 | J6 | J7 | J8 | D1 | D2 | D3 | D1 | D2 | D3 |
| Normal | H | H | H | H | L | L | L | L | L | L | L | H | L | L | L | 0 | 0 | 1 | 0 | 0 | 1 |
| Abnormal | H | H | H | L | H | L | L | L | L | L | H | L | H | L | L | 1 | 0 | 0 | 1 | 1 | 1 |
|  | H | H | H | H | L | H | L | L | L | L | L | H | L | H | L | 0 | 0 | 1 | 0 | 1 | 1 |
|  | H | H | H | H | L | L | H | L | L | L | L | H | L | L | H | 0 | 0 | 1 | 1 | 1 | 1 |
|  | H | H | L | H | L | L | L | L | L | H | L | H | L | L | L | 0 | 0 | 0 | 0 | 1 | 1 |
|  | H | L | H | H | L | L | L | L | H | L | L | H | L | L | L | 0 | 0 | 0 | 1 | 0 | 1 |
|  | L | H | H | H | L | L | L | H | L | L | L | H | L | L | L | 0 | 0 | 0 | 0 | 0 | 1 |

Among abnormal combinations shown in Table 2, the combination at the uppermost row will be described below as an example. Although the logical value C4 output from comparator CP4 should be normally "H", it is erroneously "L". Also, the logical value C5 output from comparator CP5 should be normally "L", it is erroneously "H". In this case, the output values J4 and J6 of determining circuit DU are "H", and the other output values J1–J3, J5, J7 and J8 are "L", although only the output value J5 should be "H" and the other values J1–J4 and J6–J8 should be "L" in the normal state. Therefore, encoder EN outputs two digital codes "011" and "101" in a superposed form. When encoder EN outputs "0" prior to the other, the A/D converter outputs the digital output of "001". When encoder EN outputs "1" prior to the other, the A/D converter outputs the digital output of "111". In either case, the actually output digital code is significantly different from the code of "100" to be normally output.

reference potential, and a fourth comparator outputting a fourth comparison result signal $C_{i-2}$ indicating a result of comparison between the potential of the analog signal and the fourth reference potential. The majority logic circuit outputs the encode output signal $J_i$ satisfying the following logical expression where ∧ indicates a logical product, ∨ indicates a logical sum and ¬ indicates NOT.

$$J_i = \neg M_i \wedge M_{i-1} \qquad (1)$$
$$M_i = (C_{i+1} \wedge C_i) \vee (C_{i+1} \wedge C_{i-1}) \vee (C_i \wedge C_{i-1}) \qquad (2)$$
$$M_{i-1} = (C_i \wedge C_{i-1}) \vee (C_i \, C_{i-2}) \vee (C_{i-1} \wedge C_{i-2}) \qquad (3)$$

According to the above structure, the encode output signal satisfying expressions (1) to (3) is produced from the output signals of the plurality of comparators using the majority logic. Therefore, even if the comparator outputs an erroneous output value, it is possible to output the output value after correcting the erroneous output value by the majority logic circuit. Therefore, even if the comparator outputs the erroneous output value, the analog signal can be converted into the digital signal without causing a significant error.

An A/D converter according to another aspect of the invention for converting an analog signal into a digital signal to be output, includes a plurality of comparators making comparison between a potential of the analog signal and a reference potential, a majority logic circuit for producing an encode output signal from output signals sent from the plurality of comparators using majority logic, and an encoder encoding the encode output signal for outputting the digital signal. The reference potential includes a first reference potential, a second reference potential lower than the first reference potential, and a third reference potential lower than the second reference potential. The plurality of comparators include a first comparator outputting a first comparison result signal indicating a result of comparison between the potential of the analog signal and the first reference potential, a second comparator outputting a second comparison result signal indicating a result of comparison between the potential of the analog signal and the second reference potential, and a third comparator outputting a third comparison result signal indicating a result of comparison between the potential of the analog signal and the third reference potential. The majority logic circuit includes a first PMOS transistor having a gate receiving the first comparison result signal and receiving on one of its ends a power supply potential, a first NMOS transistor having a gate receiving the first comparison result signal and connected at one of its ends to another end of the first PMOS transistor, a second NMOS transistor having a gate receiving the third comparison result signal, connected at one of its ends to the first NMOS transistor and receiving on another end a ground potential, a second PMOS transistor having a gate receiving the second comparison result signal and receiving on one of its ends the power supply potential, a third NMOS transistor having a gate receiving the first comparison result signal and connected at one of its ends to a connection between the first PMOS transistor and the first NMOS transistor and another end of the second PMOS transistor, a fourth NMOS transistor having a gate receiving the second comparison result signal, connected at one of its ends to another end of the third NMOS transistor and receiving on another end the ground potential, a third PMOS transistor having a gate receiving the third comparison result signal, receiving on one of its ends the power supply potential and connected at another end to a connection between the second PMOS transistor and the third NMOS transistor, a fourth PMOS transistor having a gate receiving the first comparison result signal and receiving on one of its ends the power supply potential, a fifth PMOS transistor having a gate receiving the third comparison result signal, having an end connected to another end of the fourth PMOS transistor and having another end connected to another end of the third PMOS transistor, and a fifth NMOS transistor having a gate receiving the third comparison result signal, connected at one of its ends to another end of the fifth PMOS transistor and connected at another end to a connection between the third NMOS transistor and the fourth NMOS transistor.

According to the above structure, since the majority logic circuit can be formed of the circuit structure using the PMOS transistors and NMOS transistors, the majority logic circuit can be formed of a small number of elements, so that the circuit scale can be reduced. Therefore, even if the comparator outputs an erroneous output value, the analog signal can be converted into the digital signal without causing a significant error. Also, the circuit scale can be reduced, and thus the chip area can be reduced.

An A/D converter according to still another aspect of the invention for converting an analog signal into a digital signal to be output, includes a plurality of comparators making comparison between a potential of the analog signal and a reference potential, a majority logic circuit for producing an encode output signal from output signals sent from the plurality of comparators using majority logic, an encoder encoding the encode output signal for outputting the digital signal, and a control circuit outputting a first control signal and a second control signal formed of an inverted signal of the first control signal. The reference potential includes a first reference potential, a second reference potential lower than the first reference potential, and a third reference potential lower than the second reference potential. The plurality of comparators include a first comparator outputting a first comparison result signal indicating a result of comparison between the potential of the analog signal and the first reference potential, a second comparator outputting a second comparison result signal indicating a result of comparison between the potential of the analog signal and the second reference potential, and a third comparator outputting a third comparison result signal indicating a result of comparison between the potential of the analog signal and the third reference potential. The majority logic circuit includes a first switch circuit for outputting the received first comparison result signal in response to the second control signal, a second switch circuit for outputting the received second comparison result signal in response to the second control signal, a third switch circuit for outputting the received third comparison result signal in response to the second control signal, a first capacitance receiving an output of the first switch circuit, a second capacitance receiving an output of the second switch circuit, a third capacitance receiving an output of the third switch circuit, a first potential setting circuit for setting a potential of an input end of the first capacitance to a ground potential in response to the first control signal, a second potential setting circuit for setting a potential of an input end of the second capacitance to the ground potential in response to the first control signal, and a third potential setting circuit for setting a potential of an input end of the third capacitance to the ground potential in response to the first control signal. Output ends of the first to third capacitances are commonly connected to a first node. The majority logic circuit further includes a fourth potential setting circuit for setting a potential of the first node to the ground potential in response to the first control signal, and an inverting and amplifying circuit for receiving the power supply potential and the ground potential and outputting an output signal in accordance with the potential of the first node. A logical threshold Vth of the inverting and amplifying circuit satisfies a relationship of $V/3 < V_{th} < 2V/3$ where V represents the power supply potential.

According to the above structure, since the majority logic circuit is formed of a circuit structure using the capacitances, switch circuits and inverting and amplifying circuit, the majority logic circuit can be formed of a small number of elements, and a through current can be reduced. Therefore, even if the comparator outputs an erroneous output value, the analog signal can be converted into the digital signal without causing a significant error. Also, the through current can be reduced, and the power consumption can be reduced.

An A/D converter according to yet another aspect of the invention for converting an analog signal into a digital signal to be output, includes a plurality of comparators making comparison between a potential of the analog signal and a reference potential, a majority logic circuit for producing an encode output signal from output signals sent from the plurality of comparators using majority logic, and an encoder encoding the encode output signal for outputting the digital signal. The reference potential includes a first reference potential, a second reference potential lower than the first reference potential, and a third reference potential lower than the second reference potential. The plurality of comparators include a first comparator outputting a first comparison result signal indicating a result of comparison between the potential of the analog signal and the first reference potential, a second comparator outputting a second comparison result signal indicating a result of comparison between the potential of the analog signal and the second reference potential, and a third comparator outputting a third comparison result signal indicating a result of comparison between the potential of the analog signal and the third reference potential. The majority logic circuit includes first to third current supplies each receiving on one of its ends a ground potential, a first switch circuit connected between another end of the first current supply and a first node and connecting the first current supply to the first node in accordance with the first comparison result signal, a second switch circuit connected between another end of the second current supply and the first node and connecting the second current supply to the first node in accordance with the second comparison result signal, a third switch circuit connected between another end of the third current supply and the first node and connecting the third current supply to the first node in accordance with the third comparison result signal, a resistance receiving on one of its ends the power supply potential and connected at another end to the first node, and an inverting and amplifying circuit receiving the power supply potential and the ground potential for outputting an output signal in accordance with the potential of the first node. A logical threshold $V_{th}$ of the inverting and amplifying circuit satisfies a relationship of $V-2 \cdot R \cdot I < V_{th} < V-R \cdot I$ where the power supply potential is V, a current value of each of the first to third current supplies is I and a resistance value of the resistance is R.

According to the above structure, since the majority logic circuit is formed of a circuit structure using the current supplies, switch circuits, resistance, and inverting and amplifying circuit, the majority logic circuit can be formed of a small number of elements, and the circuit scale can be reduced. Therefore, even if the comparator outputs an erroneous output value, the analog signal can be converted into the digital signal without causing a significant error. Also, the circuit structure can be simplified, and the chip size can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
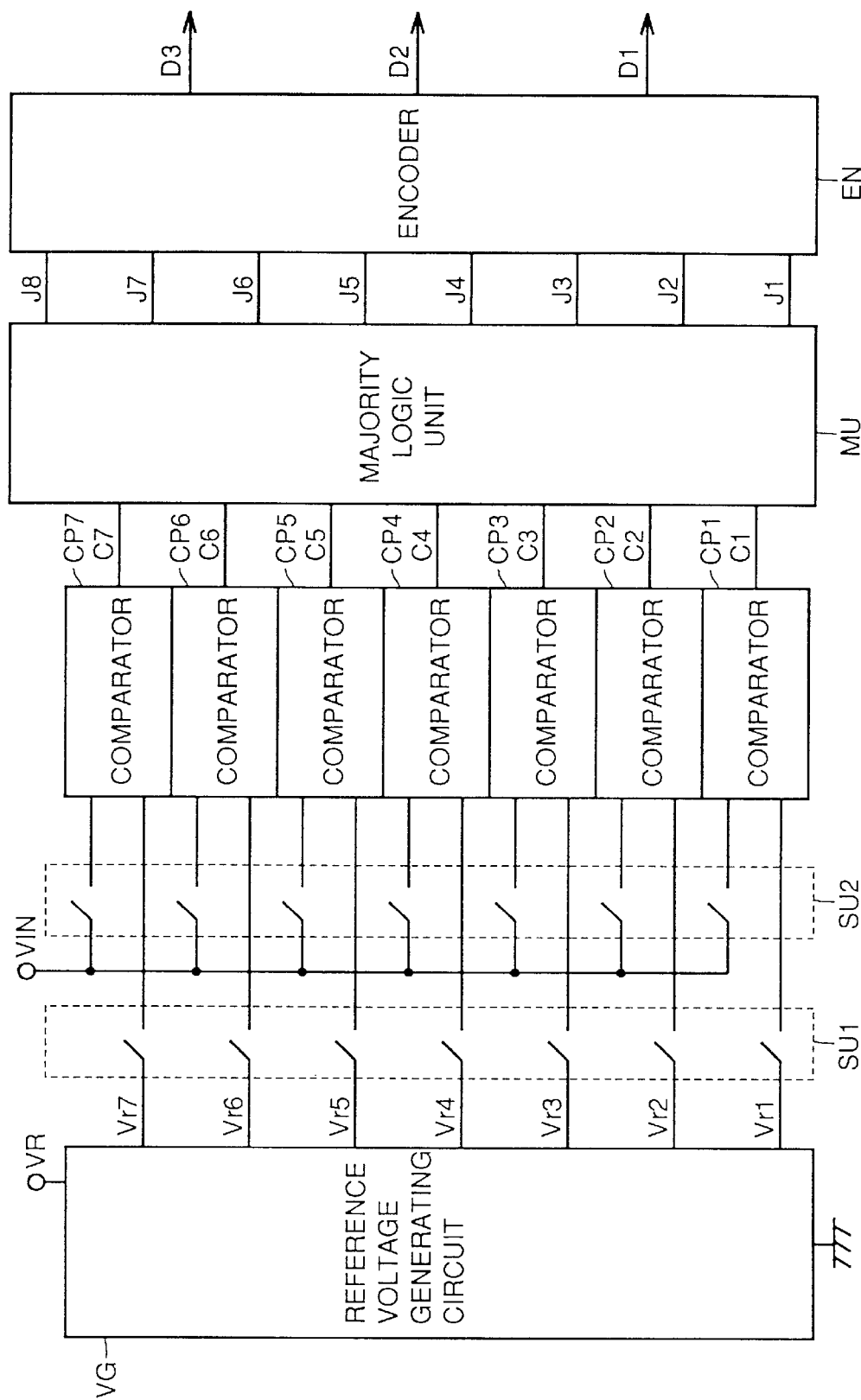
FIG. 1 is a block diagram showing a structure of an A/D converter of an embodiment of the invention.

An A/D converter of an embodiment of the invention will be described below with reference to the drawings. FIG. 1 is a block diagram showing a structure of the A/D converter of the embodiment of the invention. FIG. 1 shows a parallel A/D converter for converting an analog input signal into a digital code of 3 bits. The A/D converter to which the invention is applied is not restricted to the A/D converter for 3 bits, but can be applied to A/D converters of another number of bits. Also, the invention can be applied to series-parallel A/D converters.

Figure 10:
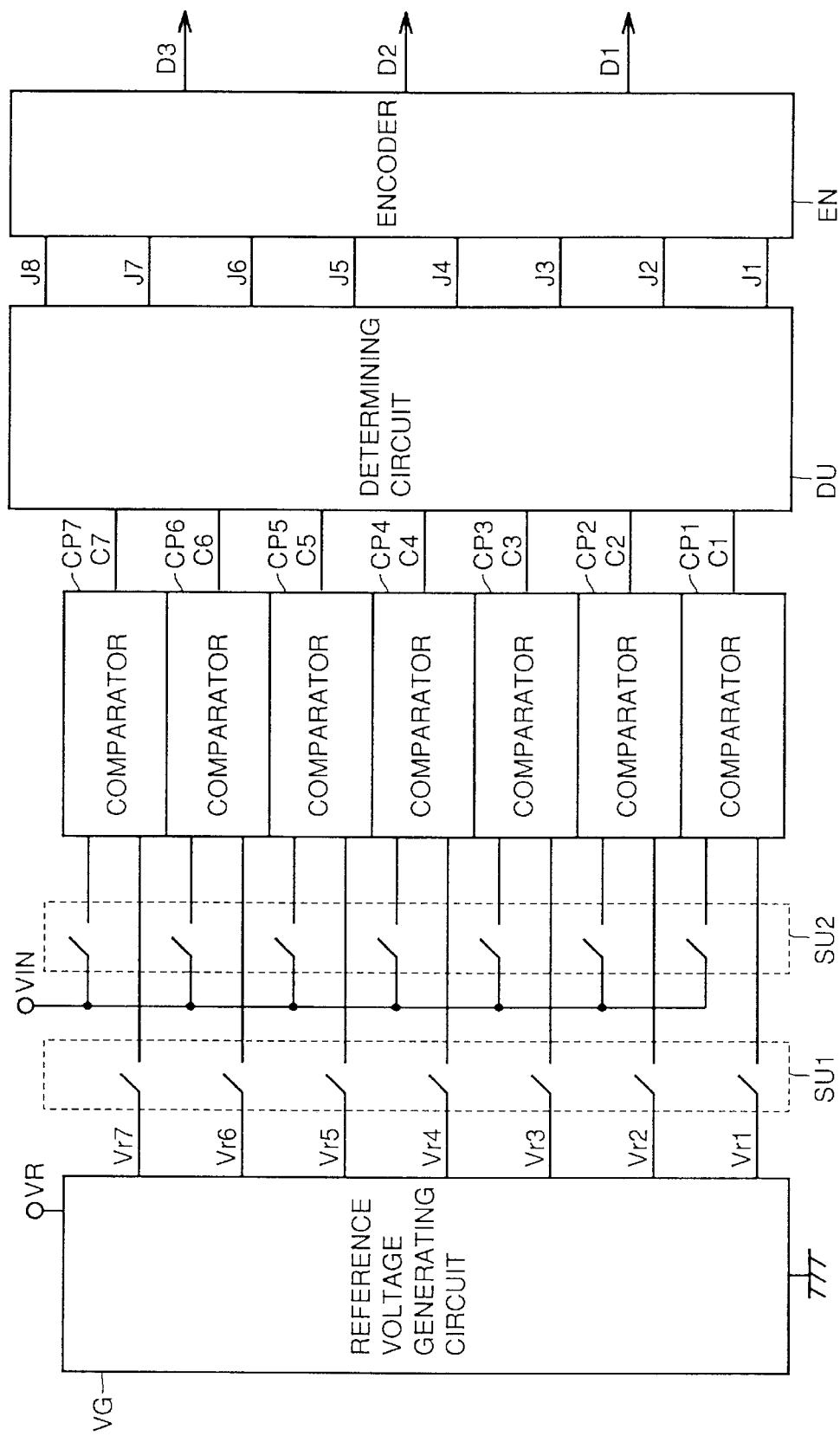
FIG. 10 is a block diagram showing a structure of a conventional A/D converter.
Figure 11:
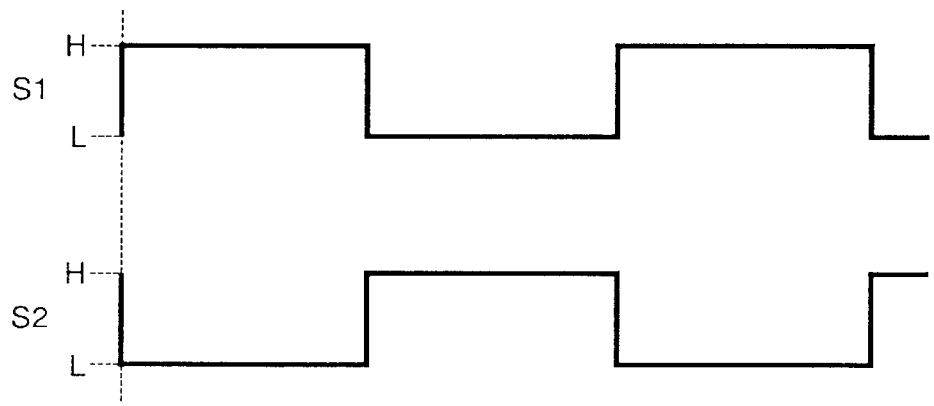
FIG. 11 shows control signals of a switch unit.
Figure 12:
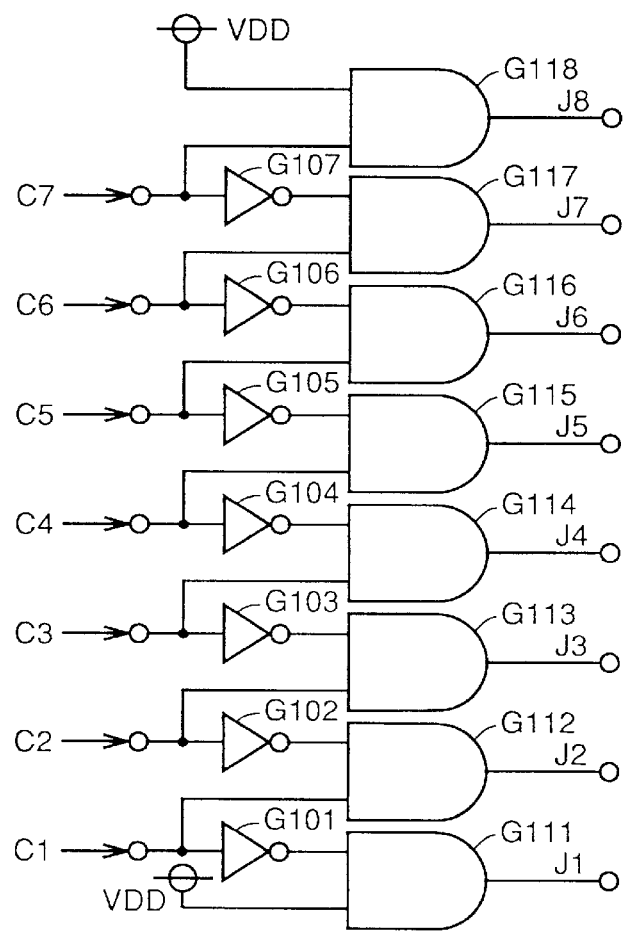
FIG. 12 is a circuit diagram showing a structure of a determining circuit shown in FIG. 10.

The A/D converter shown in FIG. 1 differs from the A/D converter shown in FIG. 10 in that a majority logic unit MU is employed instead of the determining circuit DU. The other portions and parts in FIG. 1 are the same as those in FIG. 10. The same portions and parts bear the same reference numbers and will not be described below.

In the A/D converter shown in FIG. 1, output values of comparators CP1–CP7 are supplied to the majority logic unit MU. Owing to processing which will be described later, read signals J1–J8 of an encoder similar to correct values are output even when comparators C1–C7 in majority logic unit MU output abnormal output values. Consequently, encoder EN supplies an output code D1–D3 of a value which is similar to that of the normal output code, and the A/D converter can convert an analog signal into a digital signal without causing a significant error.

Figure 2:
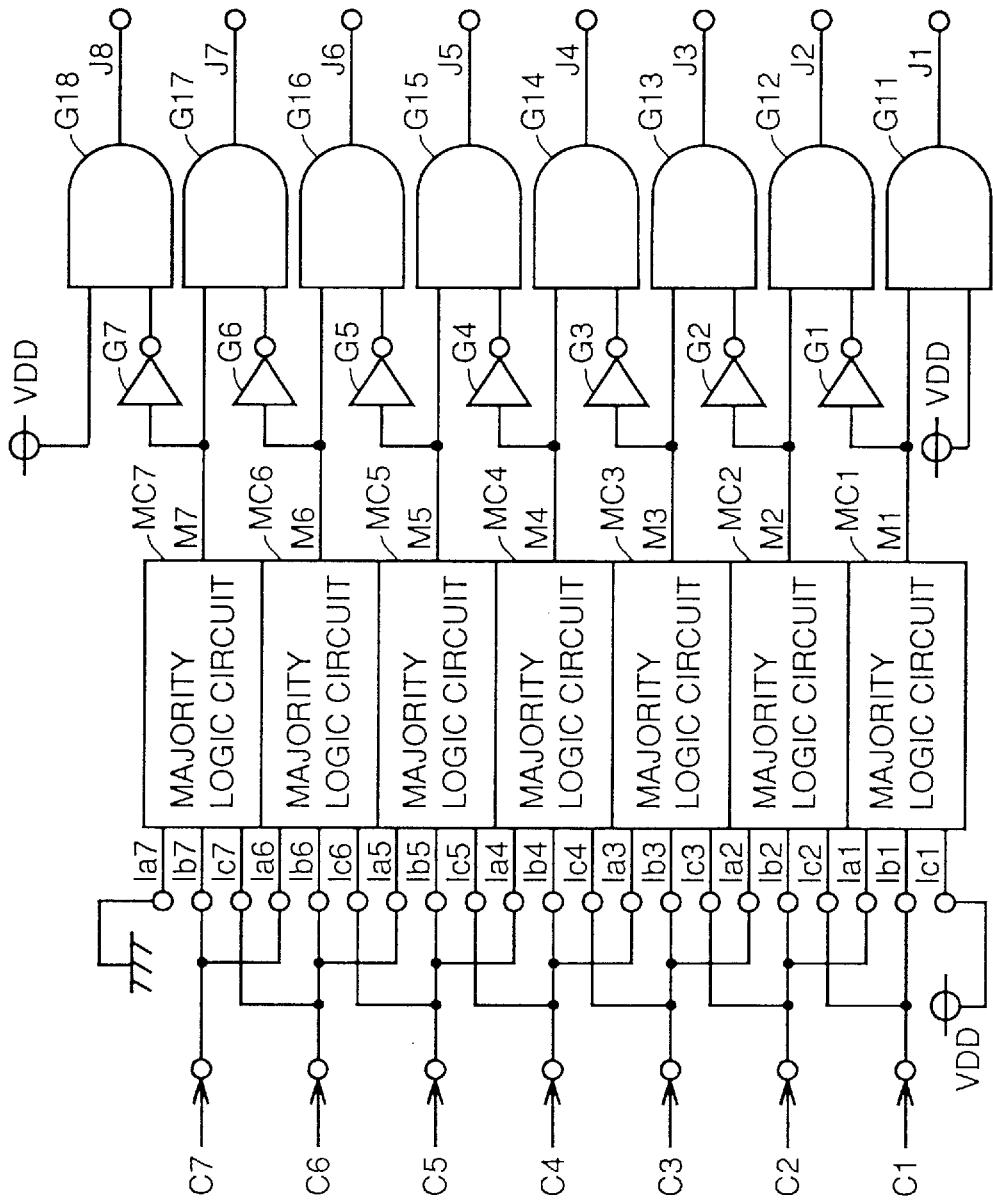
FIG. 2 shows a structure of a majority logic unit shown in FIG. 1.

Then, the majority logic unit MU shown in FIG. 1 will be specifically described below. FIG. 2 shows a structure of the majority logic unit shown in FIG. 1.

Referring to FIG. 2, the majority logic unit includes majority logic circuits MC1–MC7, inverter circuits G1–G7 and AND circuits G11–G18. Majority logic circuits MC1–MC6 receive on their input terminals Ia1–Ia6 logical values C1–C6 output from comparators CP1–CP6, respectively. Majority logic circuit MC7 receives on its first input terminal Ia7 ground potential GND, and thus a logical value "L" is applied to first input terminal Ia7. Majority logic circuits MC1–MC7 also receive on their second input terminals Ib1–Ib7 logical values C1–C7 output from comparators CP1–CP7, respectively. Majority logic circuit MCI receives on its third input terminal Ic1 a power supply voltage VDD, and thus a logical value "H" is applied to the third input terminal Ic1.

Output signals M1–M7 of majority logic circuits MC1–MC7 are supplied to the first input terminals of corresponding AND circuits G11–G17, respectively. Output signals M1–M7 are supplied to second input terminals of AND circuits G12–G18 via inverter circuits G1–G7, respectively. A second input terminal of AND circuit G11 and a second input terminal of AND circuit G18 receive power supply voltage VDD, and thus the logical value "H" is applied to these terminals. Therefore, the encoder outputs read signals J1–J8 of logical values satisfying the expression (1).

Figure 3:
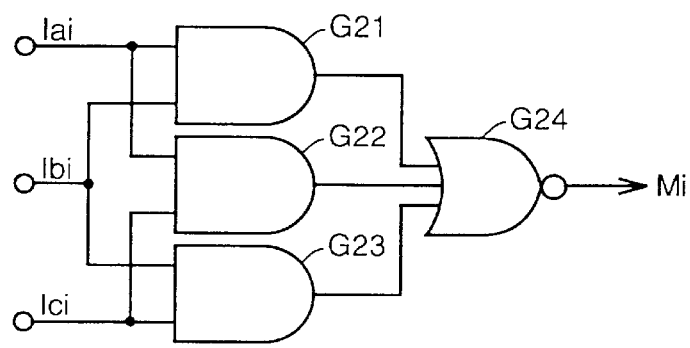
FIG. 3 is a circuit diagram showing a first specific example of the majority logic circuit shown in FIG. 2.

A first specific example of the majority logic circuit shown in FIG. 2 will be specifically described below. FIG. 3 is a circuit diagram showing the first specific example of the majority logic circuit shown in FIG. 2.

Referring to FIG. 3, the majority logic circuit includes AND circuits G21–G23 and an NOR circuit G24. First input terminal $Ia_i$ is connected to first input terminals of AND circuits G21 and G22. A second input terminal $Ib_i$ is connected to a second input terminal of AND circuit G21 and a first input terminal of AND circuit G23. Third input terminal $Ic_i$ is connected to second input terminals of AND circuits G22 and G23. Output terminals of AND circuits G21–G23 are connected to input terminals of NOR circuit G24, respectively. An output signal $M_i$ is supplied from an inverted output terminal of NOR circuit G24. According to the above connection, majority logic circuit $MC_i$ supplies output signal $M_i$ satisfying the expression (2), and majority logic circuit $MC_{i-1}$ which is lower by one position than majority logic circuit $MC_i$ supplies output signal $M_{i-1}$ satisfying the expression (3).

According to the above structure, majority logic unit MU outputs read signals $J_i$ (i=1–8) of encoder satisfying the expressions (1)–(3). Then, description will be given in connection with the following Table 3 showing a relationship between logical values C1–C7 output from comparators CP1–CP7, output values J1–J8 of majority logic unit MU and output code D1–D3 of encoder EN.

EN outputs a digital code of "100". Therefore, by using majority logic unit MU of this embodiment, output codes similar to those of the conventional A/D converter shown in Table 1 can be obtained when comparators CP1–CP7 output normal output values.

Description will not be given on the case where combination of output values of comparators CP1–CP7 is abnormal. As an example, the following Table 4 shows a relationship between the output values of majority logic unit MU, i.e., read signals J1–J8 of encoder and output codes D1–D3 of encoder EN in the case where abnormal combination occurs in connection with output values C1–C7 output from comparators CP1–CP7, which are normally to be (H, H, H, H, L, L, L).

TABLE 4

| | Output Values of Comparators | | | | | | | Output Values of Determining Circuit | | | | | | | | Output Codes | | |
|---|---|---|---|---|---|---|---|---|---|---|---|---|---|---|---|---|---|---|
| | C1 | C2 | C3 | C4 | C5 | C6 | C7 | J1 | J2 | J3 | J4 | J5 | J6 | J7 | J8 | D1 | D2 | D3 |
| Normal | H | H | H | H | L | L | L | L | L | L | L | H | L | L | L | 0 | 0 | 1 |
| Abnormal | H | H | H | L | H | L | L | L | L | L | H | L | H | L | L | 0 | 0 | 1 |
| | H | H | H | H | L | H | L | L | L | L | L | H | L | H | L | 1 | 0 | 1 |
| | H | H | H | H | L | L | H | L | L | L | L | H | L | L | H | 0 | 0 | 1 |
| | H | H | L | H | L | L | L | L | L | H | L | H | L | L | L | 1 | 1 | 0 |
| | H | L | H | H | L | L | L | L | H | L | L | H | L | L | L | 0 | 0 | 1 |
| | L | H | H | H | L | L | L | L | L | L | L | H | L | L | L | 0 | 0 | 1 |

Referring to Table 4, an example of the abnormal combination at the uppermost row shows such a case that comparator CP4 erroneously supplies output value C4 of "L", which is normally to be "H", and comparator CP5 erroneously supplies output value C5 of "H", which is normally to be "L". In this case, read signals J1–J8 of encoder are the same as those in the normal case, and more specifically, only output value J5 is "H" while other output values J1–J4 and J6–J8 are "L". Therefore, encoder EN outputs a correct digital code of "100". In the case of another abnormal combination, the output code is "101" or "011", which is similar in value to the output code of "100" to be normally output. Even in the case where comparators CP1–CP7 output erroneous output values C1–C7, majority logic unit MU of this embodiment can be used to output from encoder EN the value similar to the normal abnormal code, and thus to convert an analog signal into a digital signal without causing a significant error.

TABLE 3

| Output Values of Comparators | | | | | | | Output Values of Determining Circuit | | | | | | | | Output Codes | | |
|---|---|---|---|---|---|---|---|---|---|---|---|---|---|---|---|---|---|
| C1 | C2 | C3 | C4 | C5 | C6 | C7 | J1 | J2 | J3 | J4 | 35 | J6 | J7 | J8 | D1 | D2 | D3 |
| H | H | H | H | H | H | H | L | L | L | L | L | L | L | H | 1 | 1 | 1 |
| H | H | H | H | H | H | L | L | L | L | L | L | L | H | L | 0 | 1 | 1 |
| H | H | H | H | H | L | L | L | L | L | L | L | H | L | L | 1 | 0 | 1 |
| H | H | H | H | L | L | L | L | L | L | L | H | L | L | L | 0 | 0 | 1 |
| H | H | H | L | L | L | L | L | L | L | H | L | L | L | L | 1 | 1 | 0 |
| H | H | L | L | L | L | L | L | L | H | L | L | L | L | L | 0 | 1 | 0 |
| H | L | L | L | L | L | L | L | H | L | L | L | L | L | L | 1 | 0 | 0 |
| L | L | L | L | L | L | L | H | L | L | L | L | L | L | L | 0 | 0 | 0 |

Figure 4:
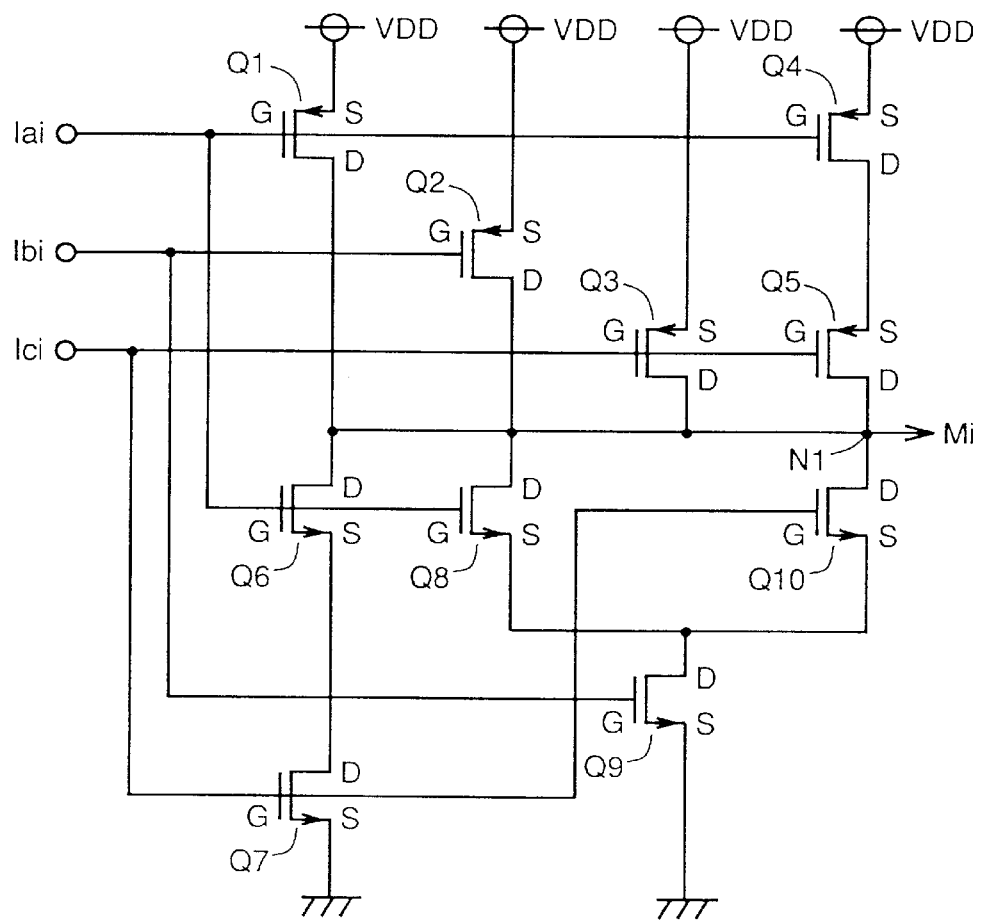
FIG. 4 is a circuit diagram showing a second specific example of the majority logic circuit shown in FIG. 2.

Referring to Table 3, when output values C1–C7 output from comparators CP1–CP7 are (H, H, H, H, L, L, L), only output value J5 of the majority logic unit is "H", and other output values J1–J4 and J6–J8 are "L". In this case, encoder A second specific example of the majority logic circuit shown in FIG. 2 will be described below. FIG. 4 is a circuit diagram showing the second specific example of the majority logic circuit shown in FIG. 2.

Referring to FIG. 4, the majority logic circuit includes P-channel conductivity type MOS transistors (which will be referred to as "PMOS transistors"hereafter) Q1–Q5 and N-channel conductivity type MOS transistors (which will be referred to as "NMOS transistors" hereafter) Q6–Q10.

PMOS transistor Q1 has a source terminal S receiving power supply potential VDD, a gate terminal G connected to first input terminal $Ia_i$ and a drain terminal D connected to a node N1. PMOS transistor Q2 has a source terminal S receiving power supply potential VDD, a gate terminal G connected to second input terminal $Ib_i$ and a drain terminal D connected to node N1. PMOS transistor Q3 has a source terminal S receiving power supply potential VDD, a gate terminal G connected to third input terminal $Ic_i$ and a drain terminal D connected to node N1. PMOS transistor Q4 has a source terminal S receiving power supply potential VDD, a gate terminal G connected to first input terminal $Ia_i$ and a drain terminal D connected to a source terminal S of PMOS transistor Q5. PMOS transistor Q5 has a gate terminal G connected to third input terminal $Ic_i$ and a drain terminal D connected to node N1.

NMOS transistor Q6 has a gate terminal G connected to first input terminal $Ia_i$, a drain terminal D connected to node N1 and a source terminal S connected to a drain terminal D of NMOS transistor Q7. NMOS transistor Q7 has a source terminal S receiving ground potential GND and a gate terminal G connected to third input terminal $Ic_i$. NMOS transistor Q8 has a drain terminal D connected to node N1, a gate terminal G connected to first input terminal $Ia_i$ and a source terminal connected to a drain terminal D of NMOS transistor Q9. NMOS transistor Q9 has a gate terminal connected to second input terminal $Ib_i$ and a source terminal S receiving ground potential GND. NMOS transistor Q10 has a drain terminal D connected to node N1, a gate terminal G connected to third input terminal $Ic_i$ and a source terminal S connected to a drain terminal D of NMOS transistor Q9.

By applying the majority logic circuits thus constructed to the majority logic unit shown in FIG. 2, it is possible to produce output signals $M_i$ and $M_{i-1}$ satisfying the expressions (2) and (3). Therefore, it is possible to output read signals $J_i$ satisfying the expression (1) even by the majority logic unit using the majority logic circuits shown in FIG. 4. As a result, also in the A/D converter using the majority logic circuits shown in FIG. 4, it is possible to obtain the output codes shown in Tables 3 and 4, and thus, the analog signal can be converted into the digital signal without causing a significant error even when the comparators output erroneous output values. Further, the majority logic circuit shown in FIG. 4 can be formed of elements of transistors which are smaller in number than those of the majority logic circuit shown in FIG. 3, so that the circuit structure of A/D converter can be simplified, and the chip size can be reduced.

Figure 5:
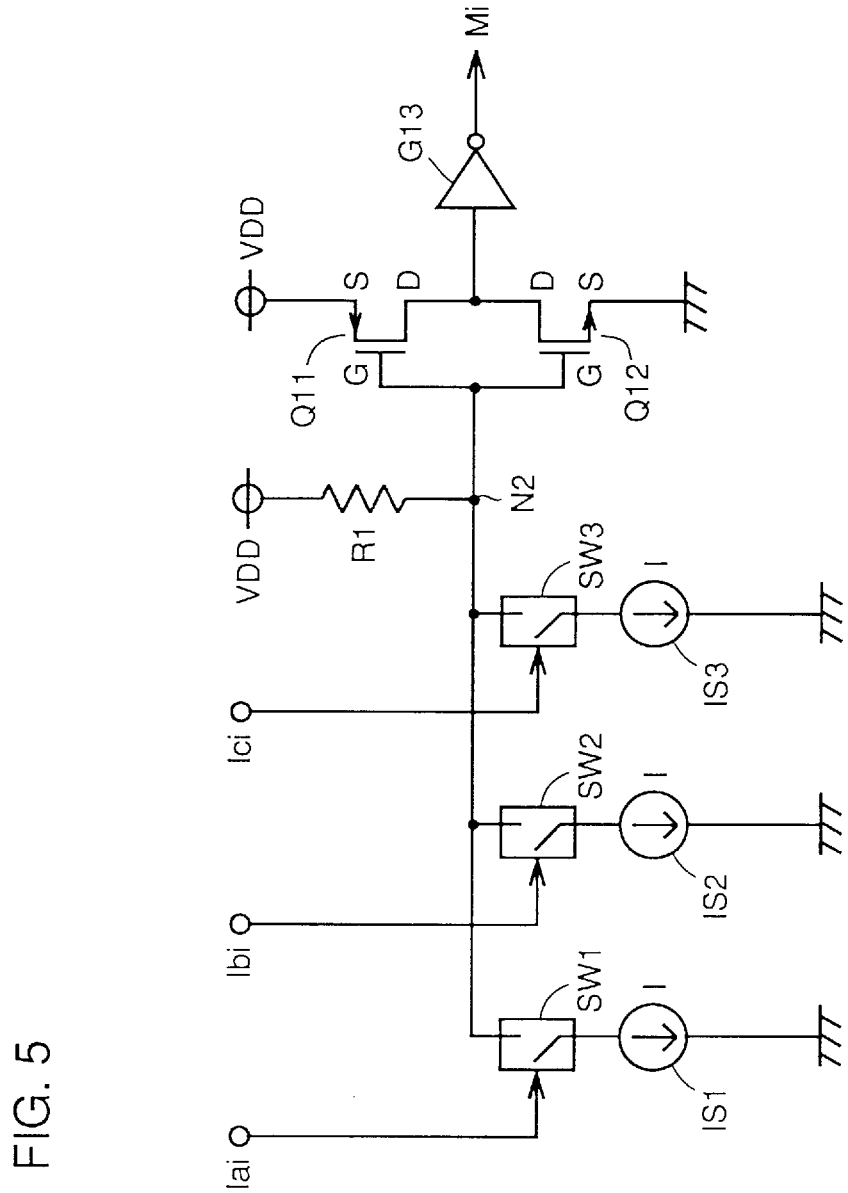
FIG. 5 is a circuit diagram showing a third specific example of the majority logic circuit shown in FIG. 2.

Description will now be given on a third specific example of the majority logic circuit shown in FIG. 2. FIG. 5 is a circuit diagram showing the third specific example of the majority logic circuit shown in FIG. 2.

Referring to FIG. 5, the majority logic circuit includes current supplies IS1–IS3, switches SW1–SW3, a resistance R1, a PMOS transistor Q11, an NMOS transistor Q12 and an inverter circuit G31.

The current supplies IS1–IS3 can supply currents of an equal value I. Each of current supplies IS1–IS3 is supplied at one of its ends with ground potential GND. The other end of current supply IS1 is connected to switch SW1. Switch SW1 is connected to a node N2. Switch SW1 is turned on and off in accordance with an output value Ca of comparator sent through input terminal $Ia_i$. Likewise, constant current supplies IS2 and IS3 are connected to node N2 via switches SW2 and SW3, respectively, and are turned on and off in accordance with an output value Cb of comparator sent through second input terminal $Ib_i$ and an output value Cc of comparator sent through third input terminal $Ic_i$. Resistance RI is connected at one of its ends to node N2, and receives power supply potential VDD on the other end. PMOS transistor Q11 has a source terminal S receiving power supply potential VDD, a gate terminal G connected to node N2 and a drain terminal D connected to a drain terminal D of NMOS transistor Q12. NMOS transistor Q12 has a gate terminal G connected to node N2 and a source terminal S receiving ground potential GND. An output terminal of inverter circuit G31 is connected to drain terminals D of PMOS transistor Q11 and NMOS transistor Q12. Inverter circuit G31 produces output signal $M_i$ of the majority logic circuit.

Description will now be given on operation of the majority logic circuit thus constructed. The potential of node N2 and output value $M_i$ of majority logic circuit are set as follows in accordance with output values Ca, Cb and Cc of comparators applied from first, second and third input terminals $Ia_i$, $Ib_i$ and $Ic_i$. When all output values Ca, Cb and Cc of comparators applied from first, second and third input terminals $Ia_i$, $Ib_i$ and $Ic_i$ are "L", a potential VN2 of node N2 is power supply potential VDD, and output value $M_i$ of the majority logic circuit is "H". When only one of output values Ca, Cb and Cc of comparators applied from first, second and third input terminals $Ia_i$, $Ib_i$ and $Ic_i$ is "H", potential VN2 of node N2 is (VDD-RxI) where R is a resistance value of resistance R1, and output value $M_i$ of the majority logic circuit is "H". When only one of output values Ca, Cb and Cc of comparators applied from first, second and third input terminals $Ia_i$, $Ib_i$ and $Ic_i$ is "L", potential VN2 of node N2 is (VDD-R·2·I) , and output value $M_i$ of the majority logic circuit is "L". When all output values Ca, Cb and Cc of comparators applied from first, second and third input terminals $Ia_i$, $Ib_i$ and $Ic_i$ are "H", potential VN2 of node N2 is (VDD-R·3·I) , and output value $M_i$ of the majority logic circuit is "L". In summary, input logical values Ca, Cb and Cc, potential VN2 of node N2 and output value Mi of the majority logic circuit are set as shown in the following Table 5 according to the above operation.

TABLE 5

| Input Logical Value | | | Potential | Output |
|---|---|---|---|---|
| Ca | Cb | Cc | of N2 (VN2) | Values |
| H | H | H | VDD-R.3.I | L |
| H | H | L | VDD-R.2.I | L |
| H | L | H | | |
| L | H | H | | |
| H | L | L | VDD-R.I | H |
| L | H | L | | |
| L | L | H | | |
| L | L | H | VDD | H |

In order to achieve the above operation, parameters such as gate widths of PMOS transistor Q11 and NMOS transistor Q12 are selected to satisfy a relationship of $V-2\cdot R\cdot I<V_{th}<V-R\cdot I$ in connection with the logical threshold $V_{th}$ of the inverting and amplifying circuit formed of PMOS transistor Q11 and NMOS transistor Q12.

Owing to the above operation, it is possible to produce output signal $M_i$ and $M_{i-1}$ satisfying the expressions (2) and (3), respectively. Thus, output signal $M_i$ goes to "H" when two or more output values among output values $C_{i+1}$, $C_i$ and $C_{i-1}$ of comparators are "H", and goes to "L" when two or more of them are "L". Thereby, by using the majority logic circuits shown in FIG. 5 in the majority logic unit shown in FIG. 2, majority logic unit MU can output read signals $J_i$ of encoder satisfying the expression (1).

Accordingly, the A/D converter using the majority logic circuit shown in FIG. 5 can likewise output the output codes shown in Table 3 as is done by the A/D converter using the majority logic circuits shown in FIG. 3. Even if abnormal combination of the output values of comparators occurs, the output codes shown in Table 4 can be output. As a result, the A/D converter using the majority logic circuits shown in FIG. 5 can likewise convert an analog signal into a digital signal without causing a significant error even when the comparators output erroneous output values. Further, the majority logic circuit shown in FIG. 5 can be formed of elements smaller in number than the majority logic circuit shown in FIG. 3, so that the structure of majority logic circuit can be simplified, and the chip size of A/D converter can be reduced.

Figure 6:
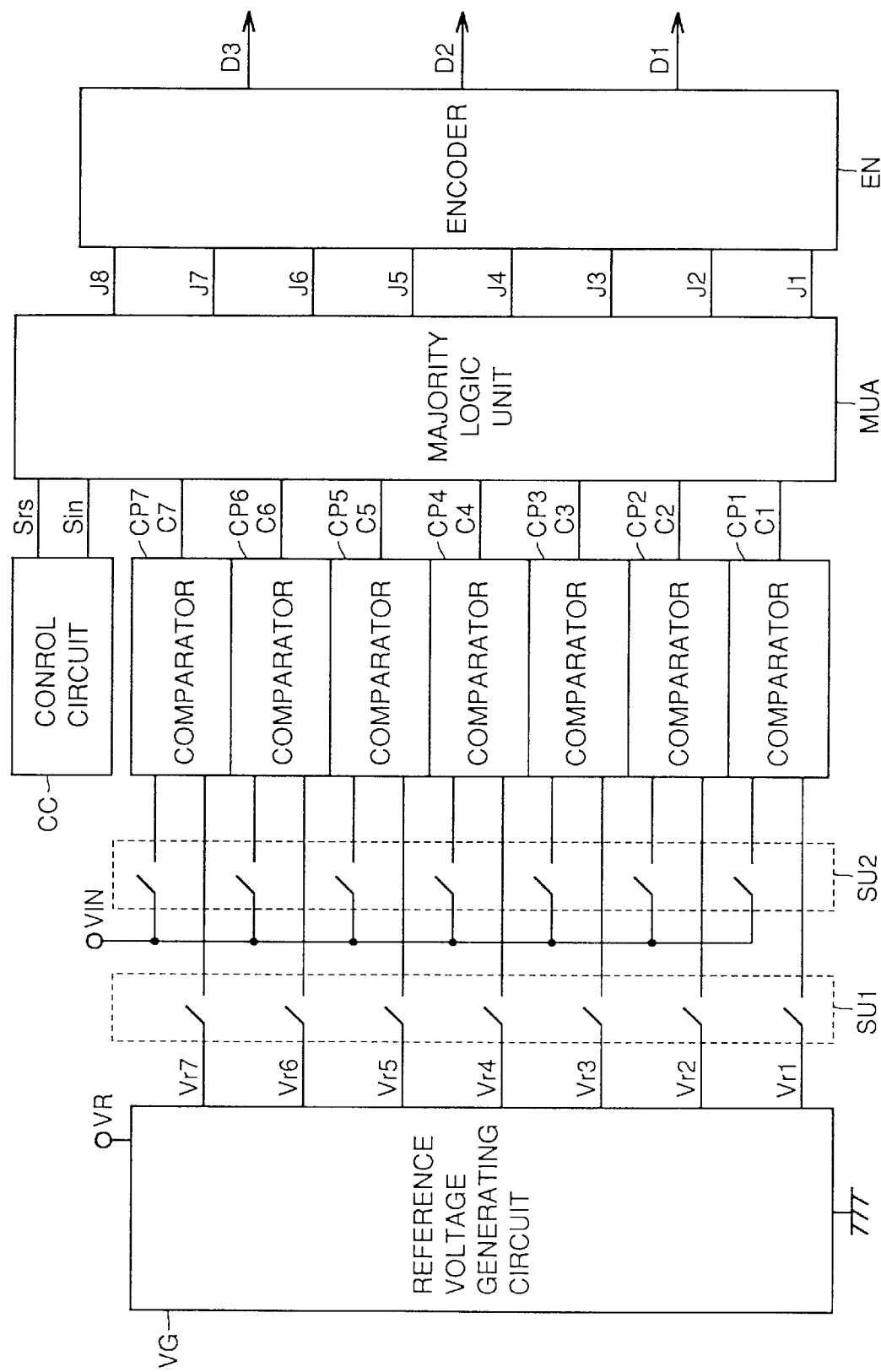
FIG. 6 is a block diagram showing a structure of an A/D converter of another embodiment of the invention.

Description will be given on an A/D converter of another embodiment of the invention. FIG. 6 is a block diagram showing a structure of the A/D converter of another embodiment of the invention. The A/D converter shown in FIG. 6 differs from the A/D converter shown in FIG. 1 in that a control circuit CC is additionally provided, and majority logic unit MU is replaced with a majority logic unit MUA which operates in accordance with control signals Srs and Sin supplied from control circuit CC. The structure other than the above is the same as that of the A/D converter shown in FIG. 1. The same parts and portions bear the same reference numbers, and will not be described below.

Figure 7:
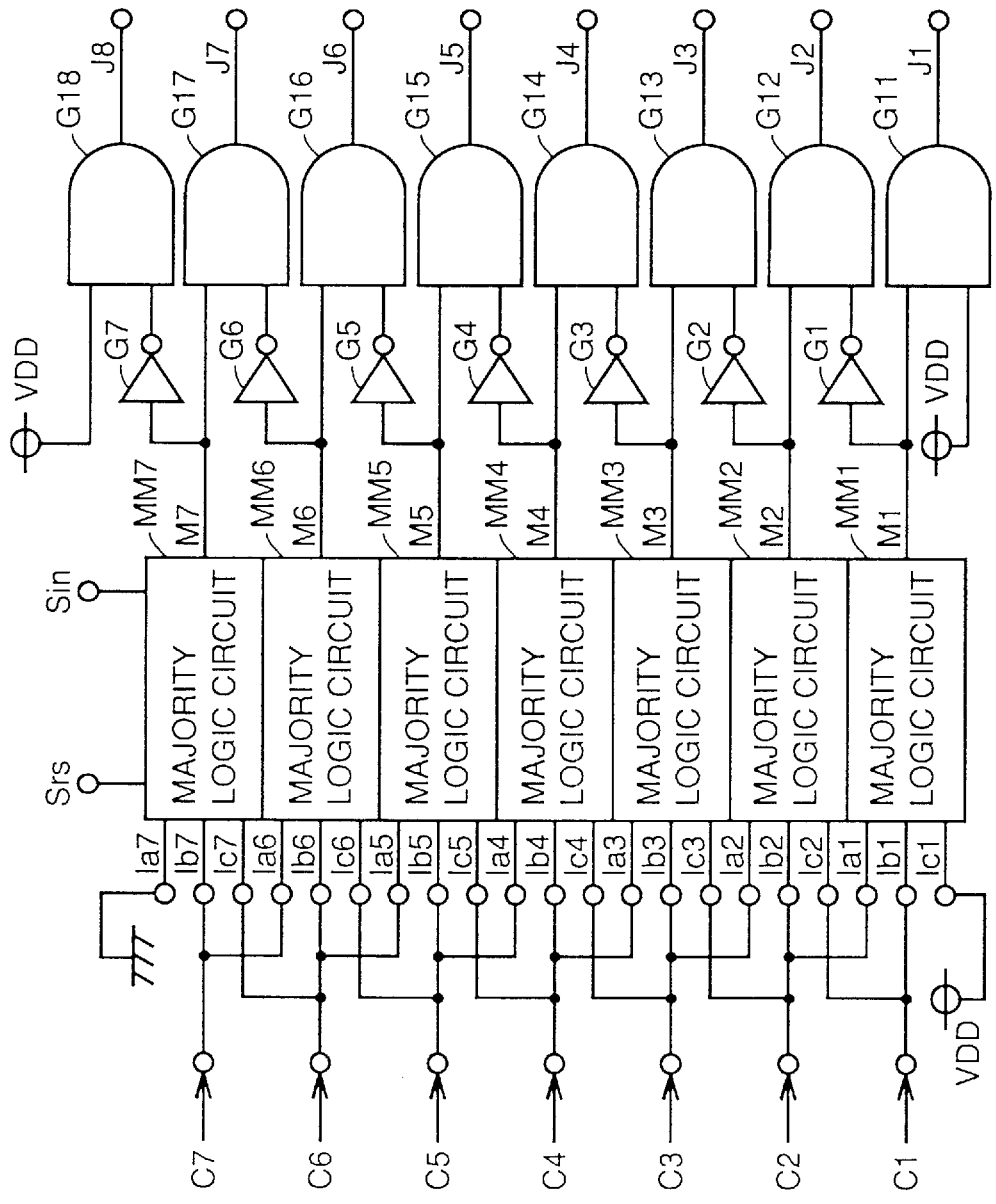
FIG. 7 shows a structure of a majority logic unit shown in FIG. 6.

Majority logic unit MUA shown in FIG. 6 will be specifically described below. FIG. 7 shows a structure of the majority logic unit shown in FIG. 6. The majority logic unit shown in FIG. 7 differs from the majority logic unit shown in FIG. 2 in that majority logic circuits MC1–MC7 are replaced with majority logic circuits MM1–MM7 which operate in accordance with control signals Srs and Sin. The structure other than the above is the same as that of the majority logic unit shown in FIG. 2. The same parts and portions bear the same reference numbers, and will not be described below.

Figure 8:
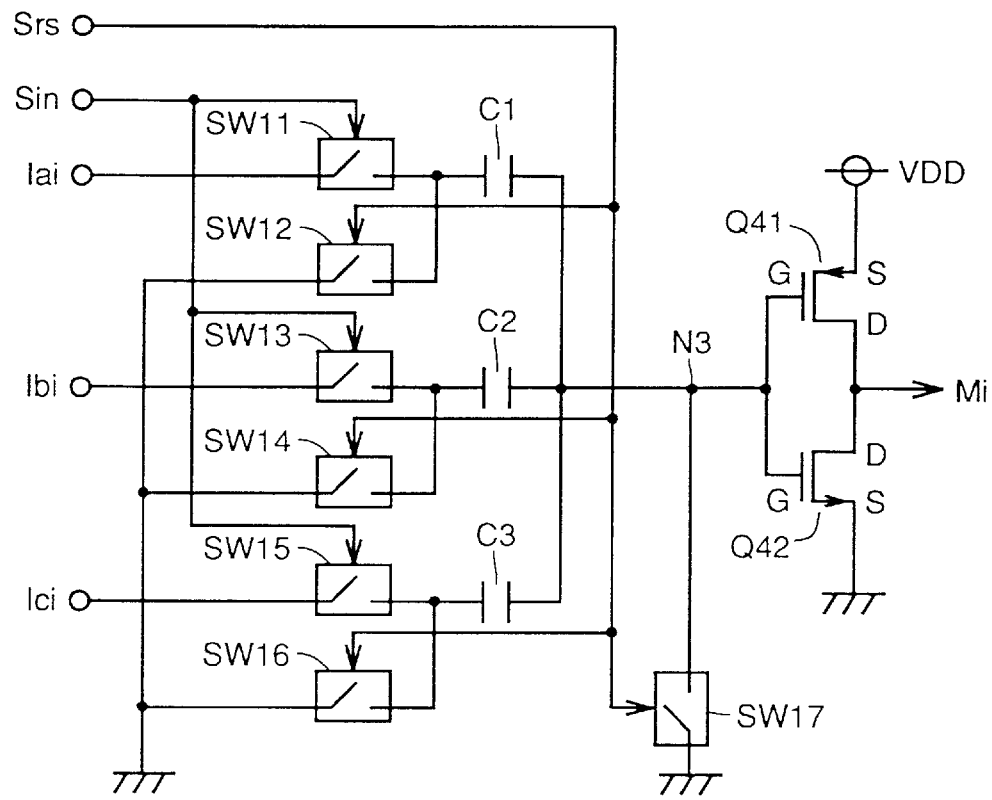
FIG. 8 is a circuit diagram showing a structure of a majority logic circuit shown in FIG. 7.

The majority logic circuit shown in FIG. 7 will be specifically described below. FIG. 8 is a circuit diagram showing a structure of the majority logic circuit shown in FIG. 7.

Referring to FIG. 8, the majority logic circuit includes switches SWl1–SW17, junction capacitances C1–C3, a PMOS transistor Q41 and an NMOS transistor Q42.

Junction capacitance C1 is connected to first input terminal Iai via switch SW11. Junction capacitance C2 is connected to second input terminal Ibi via switch SW13. Junction capacitance C3 is connected to third input terminal Ici via switch SWI5. Switches SW11, SW13 and SW15 are turned on and off in accordance with signal Sin. Output ends of junction capacitances C1–C3 are connected to a node N3. An input end of junction capacitance C1 is supplied with ground potential GND via switch SW12. An input end of junction capacitance C2 is supplied with ground potential GND via switch SW14. An input end of junction capacitance C3 is supplied with ground potential GND via switch SW 16. Node N3 is supplied with ground potential GND via switch SW17. Switches SW12, SW14, SW16 and SW17 are turned on and off in accordance with control signal Srs. PMOS transistor Q41 has a source terminal S receiving power supply potential VDD, a gate terminal G connected to node N3 and a drain terminal D connected to a drain terminal D of NMOS transistor Q42. NMOS transistor Q42 has a gate terminal G connected to node N3 and a source S receiving ground potential GND. Output signal $M_i$ is output from drain terminals D of PMOS transistor Q41 and NMOS transistor Q42.

Figure 9:
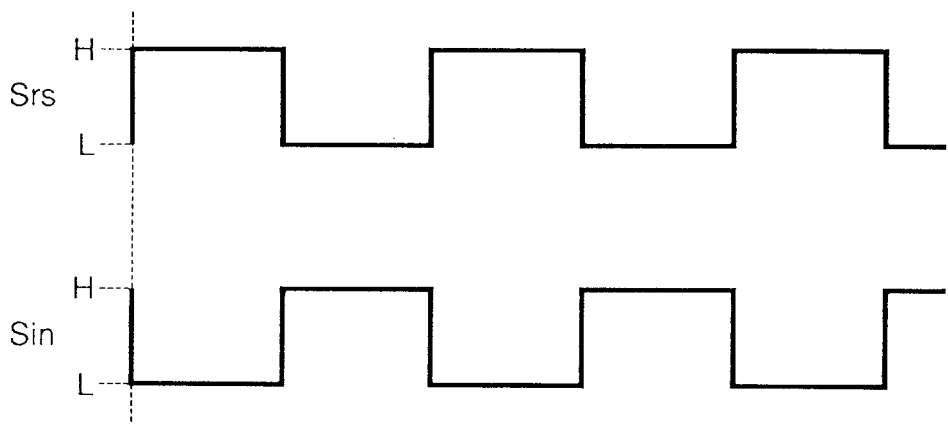
FIG. 9 shows control signals of a control circuit shown in FIG. 6.

Description will now be given on control signals Srs and Sin output from control signal CC shown in FIG. 6. FIG. 9 shows control signals Srs and Sin of the control circuit shown in FIG. 6. As shown in FIG. 9, control signal Srs has a square waveform and repetitively attains the states of "H" and "L" with a predetermined period. Control signal Sin is an inverted signal of control signal Srs. In accordance with control signals Srs and Sin, switches Sw11–SW17 are turned on and off.

Operation of the majority logic circuit thus constructed will be described below. While control signal Srs is "H" as shown in FIG. 9, switches SW12, SW14, SW16 and SW17 are on, and the input terminal of each of junction capacitances C1–C3 as well as node N3 are set to attain ground potential GND. In this manner, the node N3 is set to ground potential GND.

While control signal Sin is "H", switches SW11, SW13 and SW15 are on, and the input terminals of junction capacitances C1–C3 are connected to first, second and third input terminals $Ia_i$, $Ib_i$ and $Ic_i$, respectively. A potential VN3 of node N3 and output value $M_i$ of majority logic circuit at this time will be described below.

When all output values Ca, Cb and Cc of comparators applied through first, second and third input terminals $Ia_i$, Iab and Iac are "L", potential VN3 of node N3 is ground potential GND, and output value $M_i$ of majority logic circuit is "H".

When only one of output values Ca, Cb and Cc of comparators applied through first, second and third input terminals $Ia_i$, Iab and Iac is "H", potential VN3 of node N3 is VDD/3, and output value $M_i$ of majority logic circuit is "H".

When only one of output values Ca, Cb and Cc of comparators applied through first, second and third input terminals $Ia_i$, Iab and Iac is "L", potential VN3 of node N3 is 2·VDD/3, and output value $M_i$ of majority logic circuit is "L".

When all output values Ca, Cb and Cc of comparators applied through first, second and third input terminals $Ia_i$, Iab and Iac are "H", potential VN3 of node N3 is power supply potential VDD, and output value $M_i$ of majority logic circuit is "L".

According to the above operation, input logical values Ca, Cb and Cc of comparators, potential VN3 of node N3 and output value $M_i$ of the majority logic circuit are set as shown in the following Table 6.

TABLE 6

| Input Logical Value | | | Potential | Output |
|---|---|---|---|---|
| Ca | Cb | Cc | of N3 (VN3) | Values |
| H | H | H | VDD | L |
| H | H | L | (2/3) VDD | L |
| H | L | H | | |
| L | H | H | | |

TABLE 6-continued

| Input Logical Value | | | Potential | Output |
|---|---|---|---|---|
| Ca | Cb | Cc | of N3 (VN3) | Values |
| H | L | L | (1/3) VDD | H |
| L | H | L | | |
| L | L | H | | |
| L | L | H | GND | H |

Parameters such as gate widths of PMOS transistor Q41 and NMOS transistor Q42 are set to satisfy a relationship of $V/3 < V_{th} < 2 \cdot V/3$ in connection with the logical threshold $V_{th}$ of the inverting and amplifying circuit formed of PMOS transistor Q41 and NMOS transistor Q42.

Owing to the above operation, the majority logic circuit shown in FIG. 8 can likewise produce output signals $M_i$ and $M_{i-1}$ satisfying the expressions (2) and (3), respectively. Since the majority logic unit MUA shown in FIG. 7 is provided with inverter circuits G1–G7 and AND circuits G11–G18 similarly to the majority logic unit shown in FIG. 2, it can output read signals $J_i$ (i=1–8) of encoder satisfying the expression (1).

Accordingly, the A/D converter shown in FIG. 6 can likewise output the output codes shown in Table 3. Even if the output values of comparators are erroneous, the output codes shown in Table 4 can be output. As a result, the A/D converter shown in FIG. 6 can likewise convert an analog signal into a digital signal without causing a significant error even when the comparators output erroneous output values. Further, the majority logic circuit shown in FIG. 8 can be formed of elements smaller in number than the majority logic circuit shown in FIG. 3, so that the chip size of A/D converter can be reduced. Further, owing to provision of junction capacitances C1–C3, the majority logic circuit shown in FIG. 8 can suppress the through current and thus can reduce the power consumption.

Although the embodiments have been described in connection with the A/D converter, the invention can be applied to another semiconductor device in which an A/D converter and another semiconductor integrated circuit for digital signal processing are integrated on the same substrate, and can be applied particularly effectively to the structure in which comparators of an A/D converter must use reference voltages of a minute width for comparison. For example, in the field of image processing, an A/D converter and another semiconductor integrated circuit for digital signal processing may be formed on the same substrate, and abnormal combination of logical values output from comparators may occur. Even in this case, it is possible to suppress a disadvantage such as stripe noises on a screen, and thus can prevent deterioration of image quality, because an error in digital codes output from the A/D converter is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog/digital converter for converting an analog signal into a digital signal to be output, comprising:
    a plurality of comparators making comparison between a potential of said analog signal and a plurality of reference potentials;
    majority logic means for producing an encode output signal from output signals sent from said plurality of comparators using majority logic; and
    an encoder encoding said encode output signal for outputting said digital signal, wherein
    said reference potentials include a first reference potential,
    a second reference potential lower than said first reference potential,
    a third reference potential lower than said second reference potential, and
    a fourth reference potential lower than said third reference potential;
    said plurality of comparators include:
        a first comparator outputting a first comparison result signal $C_{i+1}$ indicating a result of comparison between the potential of said analog signal and said first reference potential,
        a second comparator outputting a second comparison result signal indicating a result of comparison between the potential $C_i$ of said analog signal and said second reference potential, a third comparator outputting a third comparison result signal $C_{i-1}$ indicating a result of comparison between the potential of said analog signal and said third reference potential, and
        a fourth comparator outputting a fourth comparison result signal $C_{i-2}$ indicating a result of comparison between the potential of said analog signal and said fourth reference potential;
    said majority logic means includes:
        a first PMOS transistor having a gate receiving said first comparison result signal and receiving on one of its ends a power supply potential,
        a first NMOS transistor having a gate receiving said first comparison result signal and connected at one of its ends to another end of said first PMOS transistor,
        a second NMOS transistor having a gate receiving said third comparison result signal, connected at one of its ends to said first NMOS transistor and receiving on another end a ground potential,
        a second PMOS transistor having a gate receiving said second comparison result signal and receiving on one of its ends said power supply potential,
        a third NMOS transistor having a gate receiving said first comparison result signal and connected at one of its ends to a connection between said first PMOS transistor and said first NMOS transistor and another end of said second PMOS transistor,
        a fourth NMOS transistor having a gate receiving said second comparison result signal, connected at one of its ends to another end of said third NMOS transistor and receiving on another end said ground potential,
    a third PMOS transistor having a gate receiving said third comparison result signal, receiving on one of its ends said power supply potential and connected at another end to a connection between said second PMOS transistor and said third NMOS transistor,
        a fourth PMOS transistor having a gate receiving said first comparison result signal and receiving on one of its ends said power supply potential,
        a fifth PMOS transistor having a gate receiving said third comparison result signal, having an end connected to another end of said fourth PMOS transistor and having another end connected to another end of said third PMOS transistor, and
        a fifth NMOS transistor having a gate receiving said third comparison result signal, connected at one of its ends to another end of said fifth PMOS transistor and connected at another end to a connection between said third NMOS transistor and said fourth NMOS transistor, and said majority logic means outputs the encode output signal $J_i$ satisfying the following logical expression where $\wedge$ indicates a logical product, v indicates a logical sum and $\neg$ indicates NOT:

$$J_i = \neg Mi \wedge M_{i-1} \quad (1)$$
$$M_i = (C_{i+1} \wedge C_i) \vee (C_{i+1} \wedge C_{i-1}) \vee (C_i \wedge C_{i-1}) \quad (2)$$
$$M_{i-1} = (C_i \wedge C_{i-1}) \vee (C_{i-1} \wedge C_{i-2}) \quad (3).$$

2. The analog/digital converter according to claim 1, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

3. An analog/digital converter for converting an analog signal into a digital signal to be output, comprising:

a plurality of comparators making comparison between a potential of said analog signal and a Plurality of reference potentials;

majority logic means for producing an encode output signal from output signals sent from said plurality of comparators using majority logic; and an encoder encoding said encode output signal for outputting said digital signal, wherein said reference potentials include a first reference potential, a second reference potential lower than said first reference potential, a third reference Potential lower than said second reference potential, and a fourth reference potential lower than said third reference potential;

said plurality of comparators include:

a first comparator outputting a first comparison result signal $C_{i+1}$ indicating a result of comparison between the Potential of said analog signal and said first reference potential, a second comparator outputting a second comparison result signal indicating a result of comparison between the potential $C_i$ of said analog signal and said second reference potential, a third comparator outputting a third comparison result signal $C_{i-1}$ indicating a result of comparison between the potential of said analog signal and said third reference potential, and a fourth comparator outputting a fourth comparison result signal $C_{i-2}$ indicating a result of comparison between the potential of said analog signal and said fourth reference potential;

said majority logic means outputs the encode output signal $J_i$ satisfying the following logical expression where A indicates a logical product, v indicates a logical sum and $\neg$ indicates NOT:

$$J_i = \neg Mi \wedge M_{i-1} \quad (1)$$
$$M_i = (C_{i+1} \wedge C_i) \vee (C_{i+1} \wedge C_{i-1}) \vee (C_i \wedge C_{i-1}) \quad (2)$$
$$M_{i-1} = (C_i \wedge C_{i-1}) \vee (C_{i-1} \wedge C_{i-2}) \quad (3)$$

said analog/digital converter further comprises control means for outputting a first control signal and a second control signal formed of an inverted signal of said first control signal;

said majority logic means includes:

first switch means for outputting said received first comparison result signal in response to said second control signal, second switch means for outputting said received second comparison result signal in response to said second control signal, third switch means for outputting said received third comparison result signal in response to said second control signal, first capacitance means for receiving an output of said first switch means, second capacitance means for receiving an output of said second switch means, third capacitance means for receiving an output of said third switch means, first potential setting means for setting a potential of an input end of said first capacitance means to a ground potential in response to said first control signal, second potential setting means for setting a potential of an input end of said second capacitance means to said ground potential in response to said first control signal, and third potential setting means for setting a potential of an input end of said third capacitance means to said ground potential in response to said first control signal;

output ends of said first to third capacitance means are commonly connected to a first node;

said majority logic means further includes:

fourth potential setting means for setting a potential of said first node to said ground potential in response to said first control signal, and inverting and amplifying means for receiving said power supply potential and said ground potential and outputting an output signal in accordance with the potential of said first node; and a logical threshold $V_{th}$ of said inverting and amplifying means satisfies a relationship of $V/3 < V_{th} < 2V/3$ where V represents said power supply potential.

4. The analog/digital converter according to claim 3, wherein said first potential setting means includes fourth switch means having an input end connected to said ground potential and an output end connected to a connection between said first switch means and said first capacitance means;

said second potential setting means includes fifth switch means having an input end connected to said ground potential and an output end connected to a connection between said second switch means and said second capacitance means;

said third potential setting means includes sixth switch means having an input end connected to said ground potential and an output end connected to a connection between said third switch means and said third capacitance means; and said inverting and amplifying means includes, a PMOS transistor having a gate receiving the potential of said first node, and receiving on one of its ends said power supply potential, and an NMOS transistor having a gate receiving the potential of said first node, connected at one of its ends to another end of said PMOS transistor and receiving on another end said ground potential.

5. The analog/digital converter according to claim 4, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

6. An analog/digital converter for converting an analog signal into a digital signal to be output, comprising:

a plurality of comparators making comparison between a potential of said analog signal and a plurality of reference potentials;

majority logic means for producing an encode output signal from output signals sent from said plurality of comparators using majority logic; and an encoder encoding said encode output signal for outputting said digital signal, wherein said reference potentials include a first reference potential, a second reference potential lower than said first reference potential, a third reference potential lower than said second reference potential, and a fourth reference potential lower than said third reference potential;

said plurality of comparators include:

a first comparator outputting a first comparison result signal $C_{i+1}$ indicating a result of comparison between the potential of said analog signal and said first reference potential, a second comparator outputting a second comparison result signal indicating a result of comparison between the potential $C_i$ of said analog signal and said second reference Dotential, a third comparator outputting a third comparison result signal $C_{i-1}$ indicating a result of comparison between the potential of said analog signal and said third reference potential, and a fourth comparator outputting a fourth comparison result signal $C_{i-2}$ indicating a result of comparison between the potential of said analog signal and said fourth reference potential;

said majority logic means outputs the encode output signal $J_i$ satisfying the following logical expression where ∧ indicates a logical product, v indicates a logical sum and ¬ indicates NOT:

$$J_i = \neg M_i \wedge M_{i-1} \tag{1}$$
$$M_i = (C_{i+1} \wedge C_i) \vee (C_{i+1} \wedge C_{i-1}) \vee (C_i \wedge C_{i-1}) \tag{2}$$
$$M_{i-1} = (C_i \wedge C_{i-1}) \vee (C_{i-1} \wedge C_{i-2}) \tag{3}$$

said majority logic means includes:

first to third current supplies each receiving on one of its ends a ground potential, first switch means connected between another end of said first current supply and a first node and connecting said first current supply to said first node in accordance with said first comparison result signal, second switch means connected between another end of said second current supply and said first node and connecting said second current supply to said first node in accordance with said second comparison result signal, third switch means connected between another end of said third current supply and said first node and connecting said third current supply to said first node in accordane with said third comparison result signal, a resistance receiving on one of its ends said power supply potential and connected at another end to said first node, and inverting and amplifying means for receiving siad power supply potential and siad ground potential for outputting an output signal in accordance with the potential of said first node; and a logical threshold $V_{th}$ of siad inverting and amplifying means satisfies a relationship of $V-2 \cdot R \cdot I < V_{th} < V - R \cdot I$ where said power supply potential is V, a current value of each of said first to third current supplies is I and a resistance value of said resistance means is R.

7. The analog/digital converter according to claim 6, wherein said inverting and amplifying means includes:

a PMOS transistor having a gate receiving the potential of said first node, and receiving on one of its ends said power supply potential, an NMOS transistor having a gate receiving the potential of said first node, connected at one of its ends to another end of said PMOS transistor and receiving on another said ground potential, and an inverter having an input end connected to a connection between said NMOS transistor and said PMOS transistor.

8. The analog/digital converter according to claim 7, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

9. An analog/digital converter for converting an analog signal into a digital signal to be output, comprising:

a plurality of comparators making comparison between a potential of said analog signal and a reference potential;

majority logic means for producing an encode output signal from output signals sent from said plurality of comparators using majority logic; and an encoder encoding said encode output signal for outputting said digital signal, wherein said reference potential includes a first reference potential, a second reference potential lower than said first reference potential, and a third reference potential lower than said second reference potential;

said plurality of comparators include:

a first comparator outputting a first comparison result signal indicating a result of comparison between the potential of said analog signal and said first reference potential, a second comparator outputting a second comparison result signal indicating a result of comparison between the potential of said analog signal and said second reference potential, and a third comparator outputting a third comparison result signal indicating a result of comparison between the potential of said analog signal and said third reference potential; and said majority logic means includes:

a first PMOS transistor having a gate receiving said first comparison result signal and receiving on one of its ends a power supply potential, a first NMOS transistor having a gate receiving said first comparison result signal and connected at one of its ends to another end of said first PMOS transistor, a second NMOS transistor having a gate receiving said third comparison result signal, connected at one of its ends to said first NMOS transistor and receiving on another end a ground potential, a second PMOS transistor having a gate receiving said second comparison result signal and receiving on one of its ends said power supply potential, a third NMOS transistor having a gate receiving said first comparison result signal and connected at one of its ends to a connection between said first PMOS transistor and said first NMOS transistor and another end of said second PMOS transistor, a fourth NMOS transistor having a gate receiving said second comparison result signal, connected at one of its ends to another end of said third NMOS transistor and receiving on another end said ground potential, a third PMOS transistor having a gate receiving said third comparison result signal, receiving on one of its ends said power supply potential and connected at another end to a connection between said second PMOS transistor and said third NMOS transistor, a fourth PMOS transistor having a gate receiving said first comparison result signal and receiving on one of its ends said power supply potential, a fifth PMOS transistor having a gate receiving said third comparison result signal, having an end connected to another end of said fourth PMOS transistor and having another end connected to another end of said third PMOS transistor, and a fifth NMOS transistor having a gate receiving said third comparison result signal, connected at one of its ends to another end of said fifth PMOS transistor and connected at another end to a connection between said third NMOS transistor and said fourth NMOS transistor.

10. The analog/digital converter according to claim 9, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

11. An analog/digital converter for converting an analog signal into a digital signal to be output, comprising:

a plurality of comparators making comparison between a potential of said analog signal and a reference potential;

majority logic means for producing an encode output signal from output signals sent from said plurality of comparators using majority logic;

an encoder encoding said encode output signal for outputting said digital signal; and control means for outputting a first control signal and a second control signal formed of an inverted signal of said first control signal, wherein said reference potential includes a first reference potential, a second reference potential lower than said first reference potential, and a third reference potential lower than said second reference potential;

said plurality of comparators include:

a first comparator outputting a first comparison result signal indicating a result of comparison between the potential of said analog signal and said first reference potential, a second comparator outputting a second comparison result signal indicating a result of comparison between the potential of said analog signal and said second reference potential, and a third comparator outputting a third comparison result signal indicating a result of comparison between the potential of said analog signal and said third reference potential;

said majority logic means includes:

first switch means for outputting said received first comparison result signal in response to said second control signal, second switch means for outputting said received second comparison result signal in response to said second control signal, third switch means for outputting said received third comparison result signal in response to said second control signal, first capacitance means for receiving an output of said first switch means, second capacitance means for receiving an output of said second switch means, third capacitance means for receiving an output of said third switch means, first potential setting means for setting a potential of an input end of said first capacitance means to a ground potential in response to said first control signal, second potential setting means for setting a potential of an input end of said second capacitance means to said ground potential in response to said first control signal, and third potential setting means for setting a potential of an input end of said third capacitance means to said ground potential in response to said first control signal;

output ends of said first to third capacitance means are commonly connected to a first node;

said majority logic means further includes:

fourth potential setting means for setting a potential of said first node to said ground potential in response to said first control signal, and inverting and amplifying means for receiving said power supply potential and said ground potential and outputting an output signal in accordance with the potential of said first node; and a logical threshold $V_{th}$ of said inverting and amplifying means satisfies a relationship of $V/3<V_{th}<2V/3$ where V represents said power supply potential.

12. The analog/digital converter according to claim 11, wherein said first potential setting means includes fourth switch means having an input end connected to said ground potential and an output end connected to a connection between said first switch means and said first capacitance means;

said second potential setting means includes fifth switch means having an input end connected to said ground potential and an output end connected to a connection between said second switch means and said second capacitance means;

said third potential setting means includes sixth switch means having an input end connected to said ground potential and an output end connected to a connection between said third switch means and said third capacitance means; and said inverting and amplifying means includes, a PMOS transistor having a gate receiving the potential of said first node, and receiving on one of its ends said power supply potential, and an NMOS transistor having a gate receiving the potential of said first node, connected at one of its ends to another end of said PMOS transistor and receiving on another end said ground potential.

13. The analog/digital converter according to claim 12, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

14. An analog/digital converter for converting an analog signal into a digital signal to be output, comprising:

a plurality of comparators making comparison between a potential of said analog signal and a reference potential;

majority logic means for producing an encode output signal from output signals sent from said plurality of comparators using majority logic; and an encoder encoding said encode output signal for outputting said digital signal, wherein said reference potential includes a first reference potential, a second reference potential lower than said first reference potential, and a third reference potential lower than said second reference potential;

said plurality of comparators include:

a first comparator outputting a first comparison result signal indicating a result of comparison between the potential of said analog signal and said first reference potential, a second comparator outputting a second comparison result signal indicating a result of comparison between the potential of said analog signal and said second reference potential, and a third comparator outputting a third comparison result signal indicating a result of comparison between the potential of said analog signal and said third reference potential;

said majority logic means includes:

first to third current supplies each receiving on one of its ends a ground potential, first switch means connected between another end of said first current supply and a first node and connecting said first current supply to said first node in accordance with said first comparison result signal, second switch means connected between another end of said second current supply and said first node and connecting said second current supply to said first node in accordance with said second comparison result signal, third switch means connected between another end of said third current supply and said first node and connecting said third current supply to said first node in accordance with said third comparison result signal, a resistance receiving on one of its ends said power supply potential and connected at another end to said first node, and inverting and amplifying means for receiving said power supply potential and said ground potential for outputting an output signal in accordance with the potential of said first node; and a logical threshold Vth of said inverting and amplifying means satisfies a relationship of $V-2 \cdot R \cdot I < V_{th} < V - R \cdot I$ where said power supply potential is V, a current value of each of said first to third current supplies is I and a resistance value of said resistance means is R.

15. The analog/digital converter according to claim 14, wherein said inverting and amplifying means includes:

a PMOS transistor having a gate receiving the potential of said first node, and receiving on one of its ends said power supply potential, an NMOS transistor having a gate receiving the potential of said first node, connected at one of its ends to another end of said PMOS transistor and receiving on another said ground potential, and an inverter having an input end connected to a connection between said NMOS transistor and said PMOS transistor.

16. The analog/digital converter according to claim 15, wherein said analog/digital converter comprises a parallel analog/digital converter converting said analog signal into digital data of 3 bits; and said majority logic means includes:

seven majority logic circuits, seven inverter circuits provided correspondingly to said seven majority logic circuits for inverting output signals of said majority logic circuits, respectively, a first AND circuit outputting a logical product of a power supply potential and the output signal of said majority logic circuit among said seven majority logic circuits at the lowermost position, six second AND circuits each outputting a logical product of the output signal of corresponding one of said seven inverter circuits and the output signal of corresponding one of said seven majority logic circuits, and a third AND circuit outputting a logical product of the power supply potential and the output signal of said inverter circuit among said seven inverter circuits at the uppermost position.

17. An analog/digital converter for converting an analog signal into a digital signal to be output, comprising:

a plurality of comparators making comparison between a potential of said analog signal and a reference potential;

majority logic means for producing an encode output signal from output signals sent from said plurality of comparators using majority logic; and an encoder encoding said encode output signal for outputting said digital signal, wherein said reference potential includes a first reference potential, a second reference potential lower than said first reference potential, and a third reference potential lower than said second reference potential;

said plurality of comparators include:

a first comparator outputting a first comparison result signal indicating a result of comparison between the potential of said analog signal and said first reference potential, a second comparator outputting a second comparison result signal indicating a result of comparison between the potential of said analog signal and said second reference potential, and a third comparator outputting a third comparison result signal indicating a result of comparison between the potential of said analog signal and said third reference potential; and said majority logic means includes an internal node, first, second and third charging means each connected to the internal node, control means for activating and inactivating said charging means in response to the first, second and third comparison result signals from said plurality of comparators, and inverting and amplifying means for providing an output signal in accordance with a potential of the internal node.

18. An analog/digital converter for converting an analog signal into a digital signal to be output, comprising:

a plurality of comparators making comparison between a potential of said analog signal and a reference potential;

majority logic means for producing an encode output signal from output signals sent from said plurality of comparators using majority logic; and an encoder encoding said encode output signal for outputting said digital signal, wherein said reference potential includes a first reference potential, a second reference potential lower than said first reference potential, and a third reference potential lower than said second reference potential;

said plurality of comparators include:

a first comparator outputting a first comparison result signal indicating a result of comparison between the potential of said analog signal and said first reference potential, a second comparator outputting a second comparison result signal indicating a result of comparison between the potential of said analog signal and said second reference potential, and a third comparator outputting a third comparison result signal indicating a result of comparison between the potential of said analog signal and said third reference potential; and said majority logic means includes an internal node, charging means connected to the internal node for charging the internal node to a power supply potential, first, second and third discharging means connected to the internal node and each discharging ⅓ of the potential of the internal node, control means for activating and inactivating the discharging means in response to the first, second and third comparison result signals from said plurality of comparators, and inverting and amplifying means for providing an output signal in accordance with a potential of the internal node.

19. An analog/digital converter for converting an analog signal into a digital signal to be output, comprising:

a plurality of comparators making comparison between a potential of said analog signal and a plurality of reference potentials;

majority logic means for producing an encode output signal from output signals sent from said plurality of comparators using majority logic; and an encoder encoding said encode output signal for outputting said digital signal, wherein said reference potential includes a first reference potential, a second reference potential lower than said first reference potential, and a third reference potential lower than said second reference potential;

said plurality of comparators includes:

a first comparator outputting a first comparison result signal indicating a result of comparison between the potential of said analog signal and said first reference potential, a second comparator outputting a second comparison result signal indicating a result of comparison between the potential of said analog signal and said second reference potential, a third comparator outputting a third comparison result signal indicating a result of comparison between the potential of said analog signal and said third reference potential; and said majority logic means includes an internal node, a potential generating circuit, connected to said internal node, for generating four different potentials at said internal node in response to said first, second and third comparison result signals inputted from said plurality of comparators, and a signal outputting circuit, the input end of said signal outputting circuit connected to said internal node, for outputting an output signal having either one of a high and a low level, the output signal level of said signal outputting circuit being determined according to the potential of said internal node.

* * * * *

UNITED STATES PATENT AND TRADEMARK OFFICE
CERTIFICATE OF CORRECTION

PATENT NO. : 5,818,380
DATED : October 6, 1998
INVENTOR(S) : Masao ITO et al

It is certified that error appears in the above-indentified patent and that said Letters Patent is hereby corrected as shown below:

On the title page, and in column 1, line 2 change "CONVERSATION" to --CONVERSION--.

Signed and Sealed this

Sixteenth Day of February, 1999

Attest:

*Acting Commissioner of Patents and Trademarks*

*Attesting Officer*